US011462457B2

(12) United States Patent
Valavala et al.

(10) Patent No.: US 11,462,457 B2
(45) Date of Patent: Oct. 4, 2022

(54) USING A THERMOELECTRIC COOLER TO REDUCE HEAT TRANSFER BETWEEN HEAT-CONDUCTING PLATES

(71) Applicant: Intel Corporation, Santa Clara, CA (US)

(72) Inventors: Krishna Vasanth Valavala, Chandler, AZ (US); Kelly Lofgreen, Phoenix, AZ (US); Chandra-Mohan Jha, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 862 days.

(21) Appl. No.: 16/142,366

(22) Filed: Sep. 26, 2018

(65) Prior Publication Data

US 2020/0098664 A1   Mar. 26, 2020

(51) Int. Cl.
*H01L 23/38* (2006.01)
*H01L 21/48* (2006.01)
*H01L 23/367* (2006.01)
*H01L 25/065* (2006.01)

(52) U.S. Cl.
CPC .......... *H01L 23/38* (2013.01); *H01L 21/4882* (2013.01); *H01L 23/3675* (2013.01); *H01L 25/0655* (2013.01)

(58) Field of Classification Search
CPC . H01L 23/38; H01L 21/4882; H01L 23/3675; H01L 25/0655; H01L 23/34; H01L 23/36; H01L 23/367; H01L 23/3736; H01L 23/42; H01L 23/12
See application file for complete search history.

(56) References Cited

U.S. PATENT DOCUMENTS

| | | | | |
|---|---|---|---|---|
| 6,094,919 A * | 8/2000 | Bhatia | ..................... | H01L 23/38 62/3.2 |
| 7,436,059 B1 * | 10/2008 | Ouyang | .................. | H01L 23/38 257/713 |
| 8,905,632 B2 * | 12/2014 | Shastri | ................ | H01S 5/02415 374/34 |
| 9,232,682 B2 * | 1/2016 | Liu | ..................... | H05K 7/20418 |
| 10,137,752 B2 * | 11/2018 | Chang | ................ | B60H 1/00392 |
| 10,461,067 B2 * | 10/2019 | Patel | ................... | H01L 23/3736 |
| 10,504,816 B2 * | 12/2019 | Beauchemin | ........... | H01L 25/50 |
| 10,763,188 B2 * | 9/2020 | Antoniswamy | ..... | H01L 21/4878 |
| 2011/0135015 A1 * | 6/2011 | Chrysler | ................ | H01L 23/38 375/259 |
| 2015/0060039 A1 * | 3/2015 | Lee | ..................... | H01L 25/0657 257/713 |
| 2018/0114741 A1 * | 4/2018 | Gagné | ..................... | H01L 23/66 |
| 2019/0341359 A1 * | 11/2019 | Tang | ....................... | H01L 24/95 |

* cited by examiner

*Primary Examiner* — Eduardo A Rodela
(74) *Attorney, Agent, or Firm* — Schwabe, Williamson & Wyatt P.C.

(57) ABSTRACT

Embodiments herein relate to systems, apparatuses, processing, and techniques related to a first heat-conducting plate to be thermally coupled to a first heat source, a thermoelectric cooler (TEC) thermally coupled to the first plate, a second heat-conducting plate thermally coupled to the TEC and to be thermally coupled to a second heat source where the TEC is to at least partially thermally isolate the first plate from the second plate to reduce heat transfer from the first plate to the second plate.

18 Claims, 8 Drawing Sheets

FIG. 8

USING A THERMOELECTRIC COOLER TO REDUCE HEAT TRANSFER BETWEEN HEAT-CONDUCTING PLATES

FIELD

Embodiments of the present disclosure generally relate to the field of integrated circuit (IC) packages, and in particular package integrated heat sinks.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Continued reduction in end product size of mobile electronic devices such as smart phones and ultrabooks is a driving force for the development of reduced size systems in package components. As a result, integrated heatsinks (IHS) may be shared by processors as well as other package components to reduce package form factor.

DETAILED DESCRIPTION

Embodiments of the present disclosure may generally relate to integrating a TEC into an IHS to mitigate high-bandwidth memory (HBM) overheating problems by controlling thermal cross talk with adjacent central processing unit (CPU)/graphics processing unit (GPU) dies that are cooled by the same IHS. Embodiments may be directed to mitigating and/or controlling thermal energy transmission, which may also be referred to as thermal "cross talk" between any plurality of dies. Embodiments may relate to a first heat-conducting plate to be thermally coupled to a first heat source, a TEC thermally coupled to the first plate, a second heat-conducting plate thermally coupled to the TEC and to be thermally coupled to a second heat source, where the TEC is to at least partially thermally isolate the first plate from the second plate to reduce heat transfer from the first plate to the second plate.

On-package integration of HBM chips is expected to increase, particularly with operations of high performance applications such as machine learning, gaming, and the like. It is desirable that HBMs integrated onto the package do not overheat, which may result in loss of HBM chip and application performance. In addition to the heat generated within the HBM during operation, heat from the adjacent CPU/GPU coupled to the same IHS may significantly contribute to higher HBM temperatures. Embodiments described herein may mitigate the HBM overheating by controlling its thermal crosstalk with the adjacent CPU/GPU die via the IHS. Embodiments presented herein may also extend to non-HBM multichip packages where controlling thermal cross talk is desirable.

A primary path for heat flow, which also may be referred to as thermal energy pathway, from a CPU/GPU to HBMs is via the IHS. Embodiments described herein may restrict this thermal energy pathway by replacing a portion of IHS between the CPU die and the HBM with low thermal conductivity thermoelectric material. Furthermore, when electrical power is applied to the TEC, heat may be pumped from HBMs to CPU, resulting in further cooling of HBMs.

It should be noted that the IHS may thermally couple multiple CPU/GPU dies, or other dies such as application-specific integrated circuits (ASICs) or the like. In addition, the satellite dies around the CPU/GPU die may dies other than HBMs.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

Figure 1:
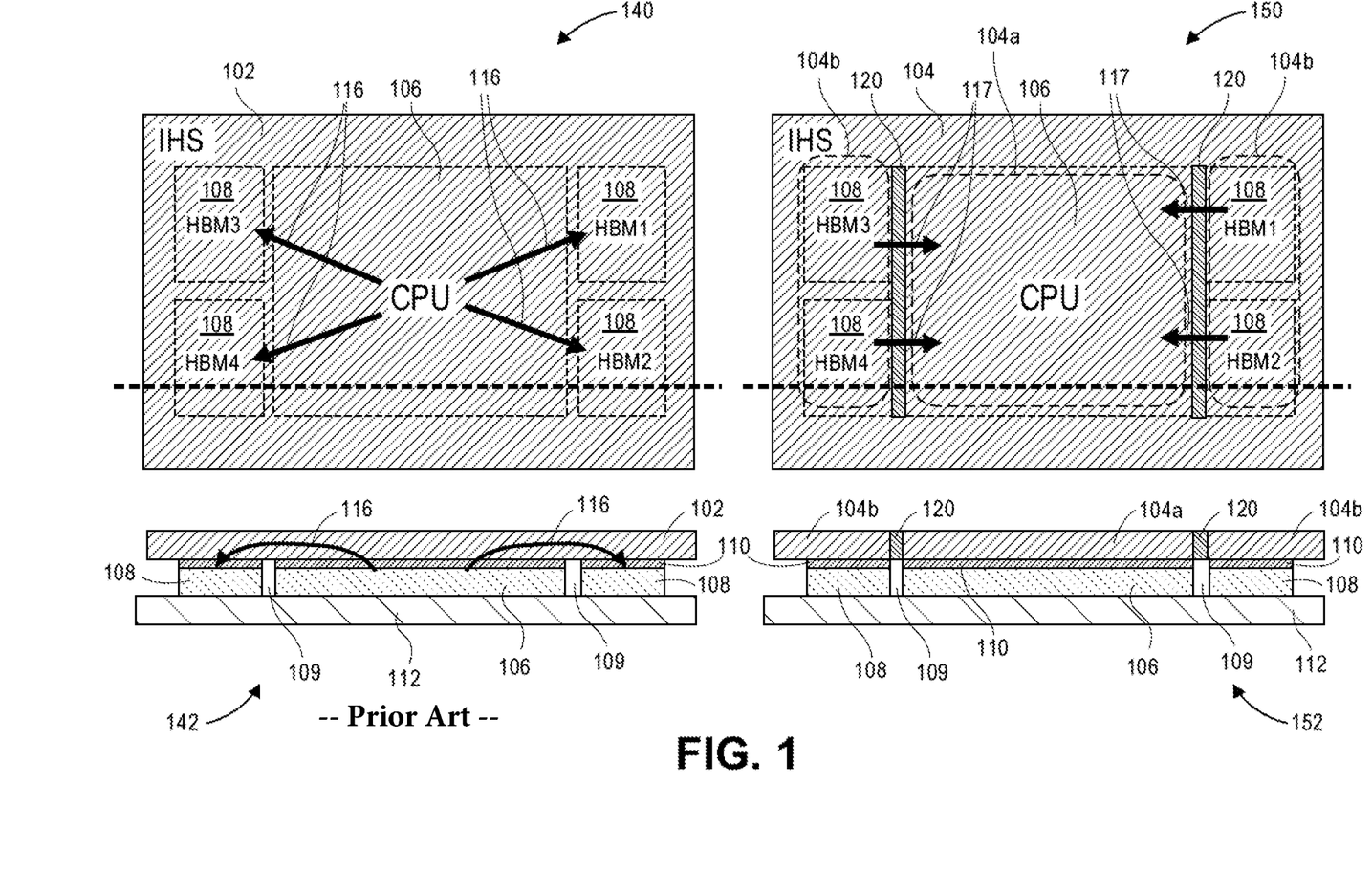
FIG. 1 illustrates an example thermoelectric cooler (TEC) integrated with an IHS, in accordance with embodiments.

FIG. 1 illustrates an example thermoelectric cooler (TEC) integrated with an IHS, in accordance with embodiments. Diagram 140 shows a top-down view of a legacy multichip package implementation of an IHS 102 thermally coupled with a CPU 106 and with HBMs 108 underneath the IHS 102. During operation of the CPU 106, which may operate at higher temperatures than the HBMs 108, thermal energy flows 116 may be directed from the CPU 106 to the HBMs 108 via the IHS 102.

Diagram 142 shows a cutaway side view of the legacy package implementation 140. IHS 102 may be thermally coupled with HBMs 108 and CPU 106 with a thermal interface material (TIM) 110. The HBMs 108 and CPU 106 may be coupled to the substrate 112. As shown, the thermal energy flows 116 may flow from the CPU 106, through the TIM 110, into the IHS 102, back through the TIM 110, and into the HBMs 108. A space 109 may separate the CPU 106 from the HBM 108. This space 109 may be air, a vacuum, a dielectric, or an insulating material to physically separate the CPU 106 from the HBMs 108.

Diagram 150 shows a configuration of a multichip package with 2 TECs 120 embedded in the IHS 104. In embodiments, the IHS 104 may be made out of copper and may be positioned on top of the dies 106, 108 to facilitate heat removal from a larger area by an external system cooling solution.

In embodiments, a TEC 120 may partially thermally separate a portion of the IHS 104a that is proximate to the CPU 106 from a portion of the IHS 104b proximate to the HBMs 108.

Diagram 152 shows a cutaway side view of the package implementation 150. As shown, the TEC 120 may pass entirely through from a first side of the IHS 104 to a second side of the IHS 104 opposite the first side. In embodiments, the TEC 120 may be adjacent to the space 109. In other embodiments as discussed below, the TEC 120 may extend only partially from the first side of the IHS 104 to the second side of the IHS 104.

Embodiments described herein may have at least two thermal benefits for the HBM 108. First, there may be a passive benefit. For example, by replacing the high thermal conductivity copper of the IHS 104, which may have a conductivity of 400 W/m/K, with a low conductivity TEC 120 material, which may have a conductivity of ~1 W/m/K, the heat flow from the higher temperature CPU 106 to lower temperature HBMs 108 through the IHS 104 is mitigated.

Second, there may be an active benefit. In embodiments, by passing electrical current through the TEC 120, heat may be pumped from the HBMs 108 towards the CPU 106, indicated by arrows 117, which may provide further thermal relief to the HBMs 108. For a non-limiting example, a maximum temperature for the CPU 106 and the HBM 108 are 105° C. and 85° C. respectively. If the CPU 106 is operating at 100° C. while the adjacent HBM 108 is operating at 90° C., the TEC 120 can be turned on to pump heat from the HBM 108 to CPU 106 until the CPU 106 reaches 105° C. while the HBM 108 cools down below 85° C. Additional examples may be shown in FIG. 2.

Figure 2:
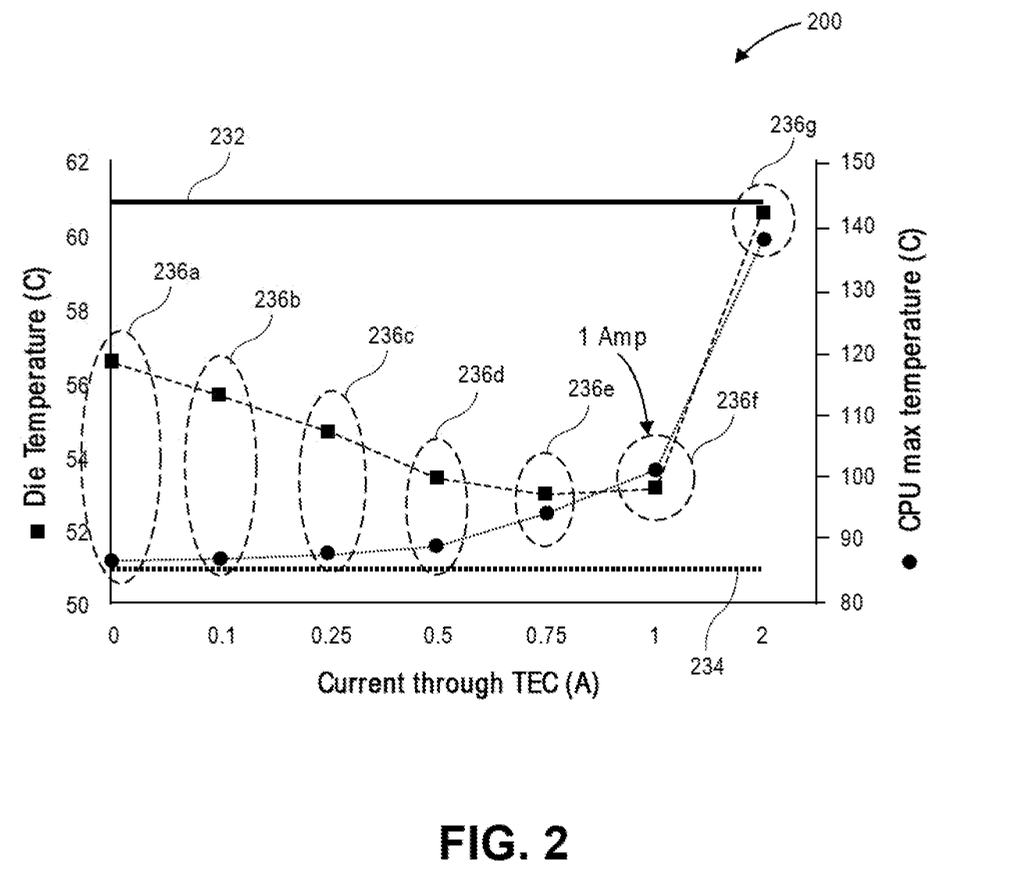
FIG. 2 shows results of modeling tests of TECs integrated with an IHS, in accordance with embodiments.

FIG. 2 shows results of modeling tests of TECs integrated with an IHS, in accordance with embodiments. Diagram 200 shows the results of modeling and subsequent simulation to determine a performance of one or more embodiments described herein.

The TIM over CPU and dies, such as TIM 110, CPU 106, and HBMs 108 in diagram 152 of FIG. 1 were modeled as a polymer blocks with uniform thermal conductivities of 1.5 and 1.6 W/m/K respectively. Uniformly distributed 500 W power was assumed in the CPU, while 12.5 W was assigned to each die block. The Seebeck coefficient, electrical resistivity, and thermal conductivity values of the thermoelectric material in the TEC, such as TEC 120 in diagram 152 of FIG. 1, were taken to be 300 $\mu$V/K, $9.1 \times 10^{-6}$ $\Omega$m, and 1 W/m/K respectively.

In a legacy package where no TEC embedded in the IHS, CPU and a die may operate at 85.3° C. and 61° C. temperatures respectively, as indicated by solid line 232 and solid line 234. By embedding TECs in the IHS, without applying any power to the TEC, CPU temperature rises to 86.7° C. while the die temperature drops by 4.4° C. to 56.6° C., as shown in region 236a. This benefit in die temperature can be attributed to the low thermal conductivity attributes of the TEC thermoelectric material throttling the thermal energy pathway from the CPU to the die. By increasing current through the TEC, a further cooling of 3.7° C. is obtained in the die at 0.75 Amp (see regions 236b-236e). This extra cooling of the die is due to heat pumping by the TEC coolers from die to the CPU. Beyond 1 Amp (see region 236g), both die and CPU start to rise in temperature due to Joule heating in the TEC elements.

Figure 3:
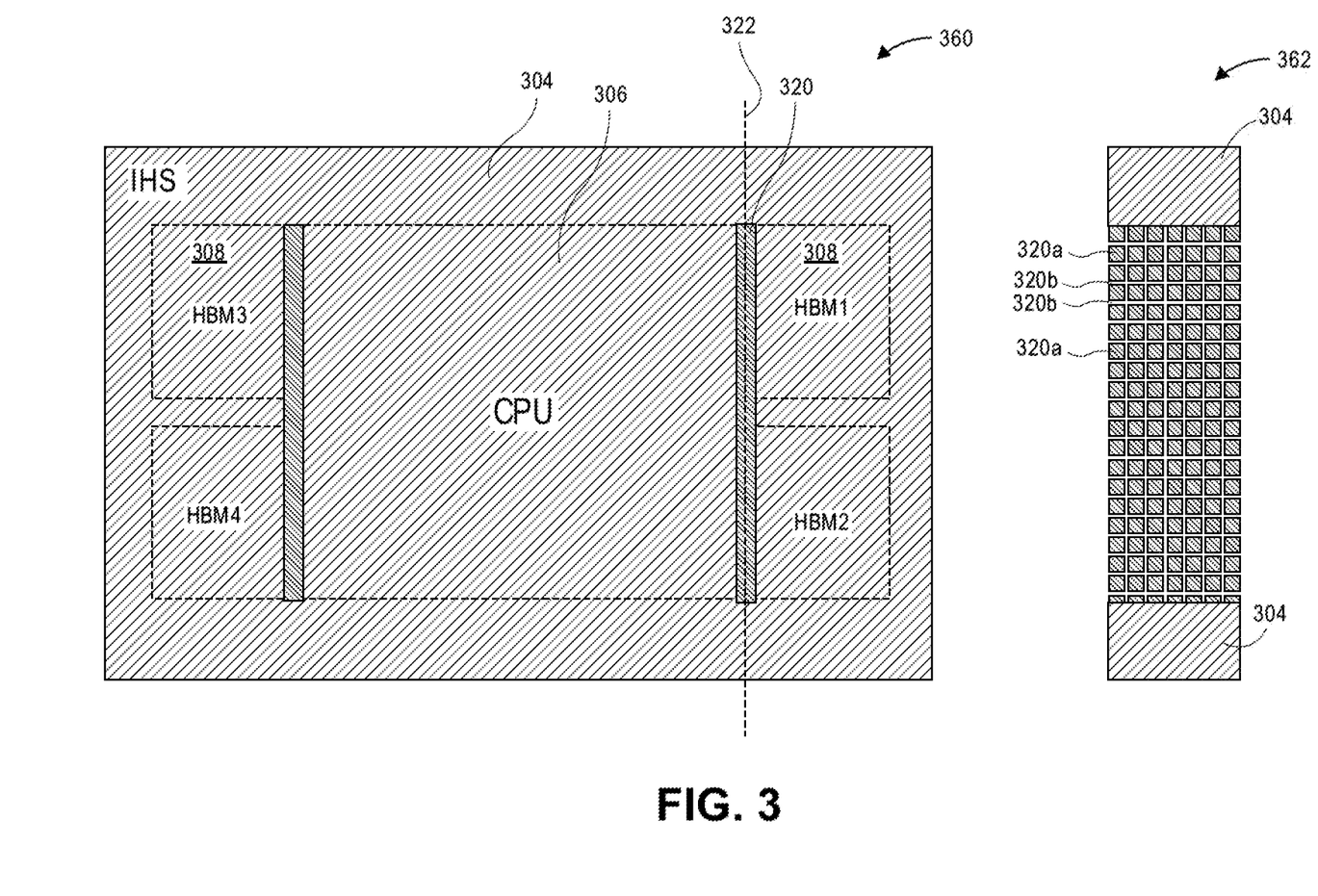
FIG. 3 shows a cross-section of a TEC integrated with an IHS, in accordance with embodiments.

FIG. 3 shows a cross-section of a TEC integrated with an IHS, in accordance with embodiments. Diagram 360 shows a top-down view of a multichip package that may be similar to diagram 152 of FIG. 1. IHS 304, CPU 306, TEC 320, and HBMs 308 may be similar to IHS 104, CPU 106, TEC 120, and HBM 108 of FIG. 1.

Diagram 362 shows a cross-section of the IHS 304 and TEC 320 at the dotted line 322. In the cross sectional view of the TEC 320, a plurality of TEC elements 320a may be electrically insulated by insulator 320b. In embodiments, the plurality of TEC elements 320a may be appropriately interconnected by metal layers may be deposited to create appropriate electrical interconnects, as discussed below.

In embodiments, the TEC elements 320a may be electrically isolated from each other by etching out a grid pattern in the TEC material and filling up the etched region with an insulating polymer like mold or Spin-on glass (SOG) to create the insulator 320b. Alternatively, additive manufacturing methods such as spark plasma sintering or chemical vapor deposition may be used to fill a grid patterned polymer structure with thermoelectric material. Metallic and dielectric layers can be deposited and etched on top and bottom following usual CMOS processes to make appropriate interconnects.

Figure 4:
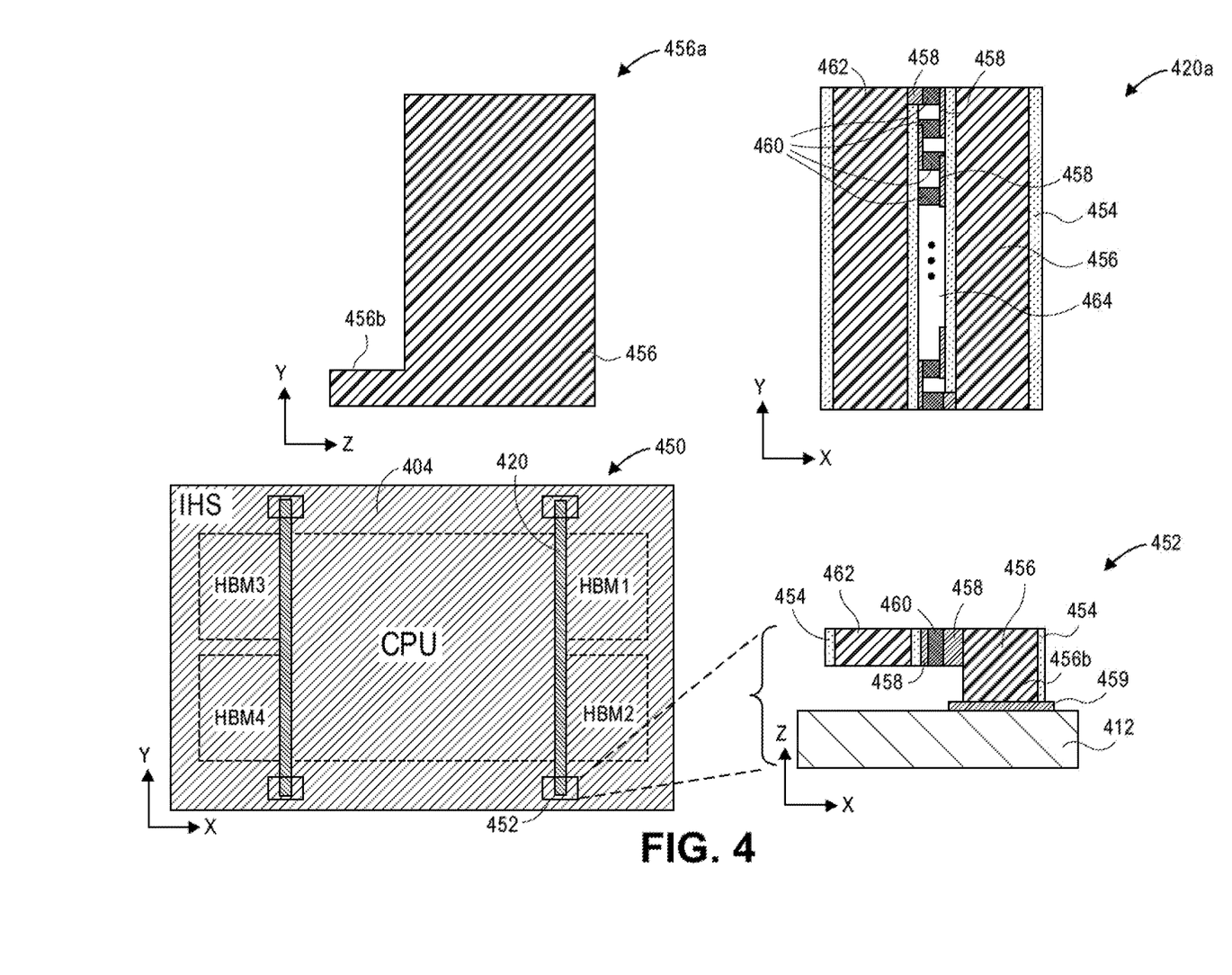
FIG. 4 illustrates an example of an electrical connection to the TEC, in accordance with embodiments.

FIG. 4 illustrates an example of an electrical connection to the TEC, in accordance with embodiments. Diagram 452, which may be similar to diagram 150 of FIG. 1, is a top-down view of a multichip package, that includes a TEC 420, which may be similar to TEC 120 of FIG. 1.

A TEC end 452 of the TEC 420 is shown in more detail in other diagrams of FIG. 4. Diagram 452 shows a view of a TEC end 452 that includes a substrate 412, which may be similar to substrate 112 of FIG. 1, to which the TEC 420 may be electrically connected. The TEC end 452 may include a first copper shim 462 and a second copper shim 456. Between the two shims there may be electrical connection 458 to couple the second copper shim 456 with a thermoelectric material 460, for example bismuth telluride ($Bi_2Te_3$). A second copper shim 456 may be may have an insulator 454 on either side of the second shim 462, which may be coupled with another electrical connection 458.

Diagram 420a shows a top-down view of a portion of the TEC 420. Between the second copper shim 456 in the first copper shim 460 may include individual instances of thermoelectric material 460 that may be electrically coupled with connections 458. In embodiments, the area between copper shim to 456 and copper shim one 462 may include dead space 464, which may be filled with the air, a vacuum, or a dielectric.

Diagram 456a shows the side view of the second copper shim 456 that has a leg 456b that may be to attach to the substrate 412. In embodiments, the legs 456b may be to connect to the substrate (see diagram 452) where there may be no active components present.

Figure 5:
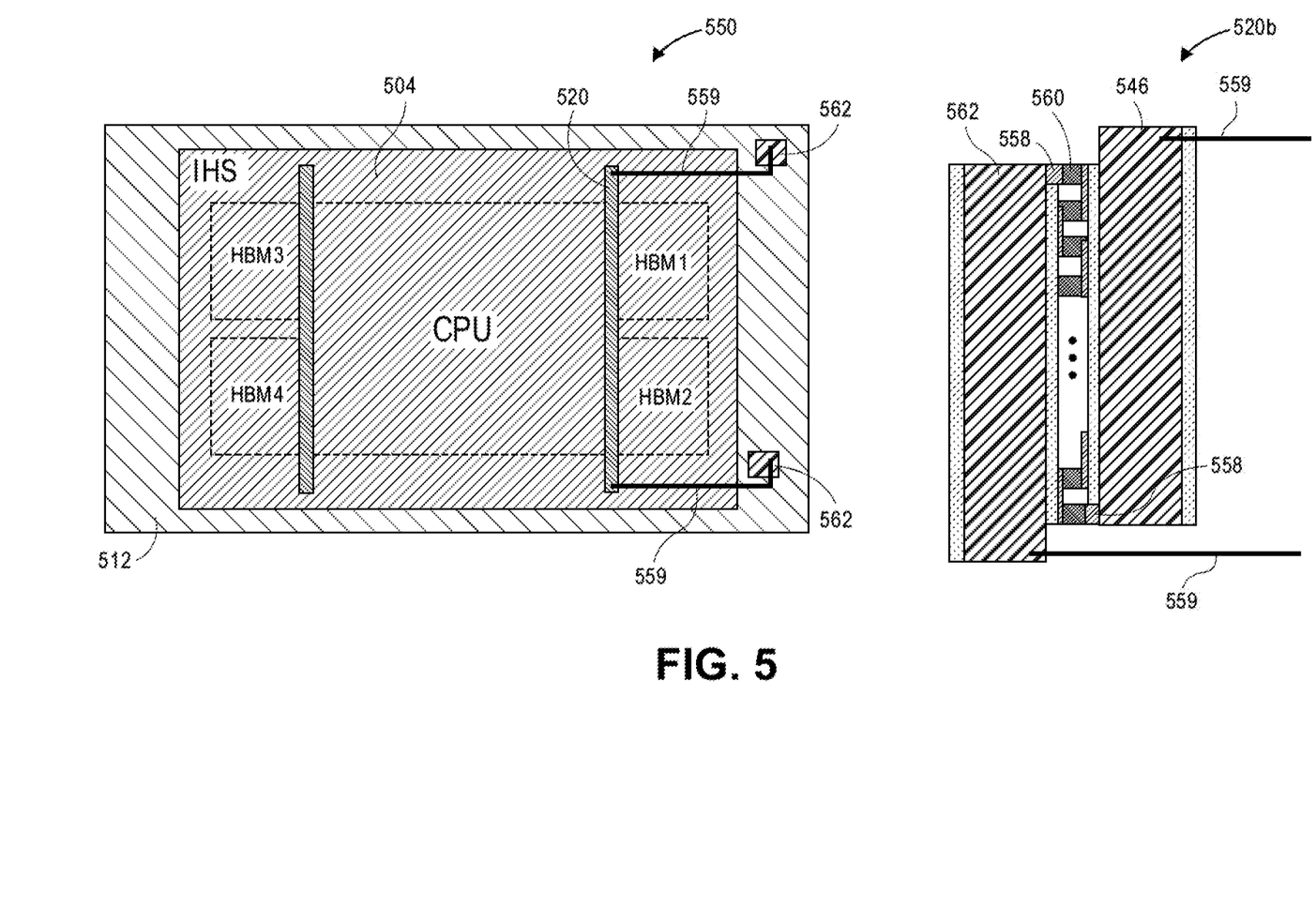
FIG. 5 illustrates another example of an electrical connection to the TEC, in accordance with embodiments.

FIG. 5 illustrates another example of an electrical connection to the TEC, in accordance with embodiments. Diagram 550, which may be similar to diagram 150 of FIG. 1, shows a top-down view of a multichip package that includes a TEC 520, which may be similar to TEC 120 of FIG. 1. In embodiments, the TEC may be electrically coupled 559 to electrical sources 562 that may be on substrate 512, which may be similar to substrate 112 of FIG. 1. In this embodiment, an electrical connection along the TEC 520 may be made by passing an insulating line 559 along groove (not shown) in the IHS 504, which may be similar to IHS 104 of FIG. 1

Diagram 520b shows a top-down view of a portion of the TEC 520. Diagram 520b may be similar to diagram 420a of FIG. 4. It includes a first copper or solder foil 562 and a second copper or solder foil 546 that surround thermoelectric material 560, which may be similar to thermoelectric material 460 of FIG. 4. Thermoelectric material 560 may be electrically coupled to the first copper or solder foil 562, the second copper or solder foil 546, and/or other thermoelectric material 560 by electrical connections 558.

Figure 6:
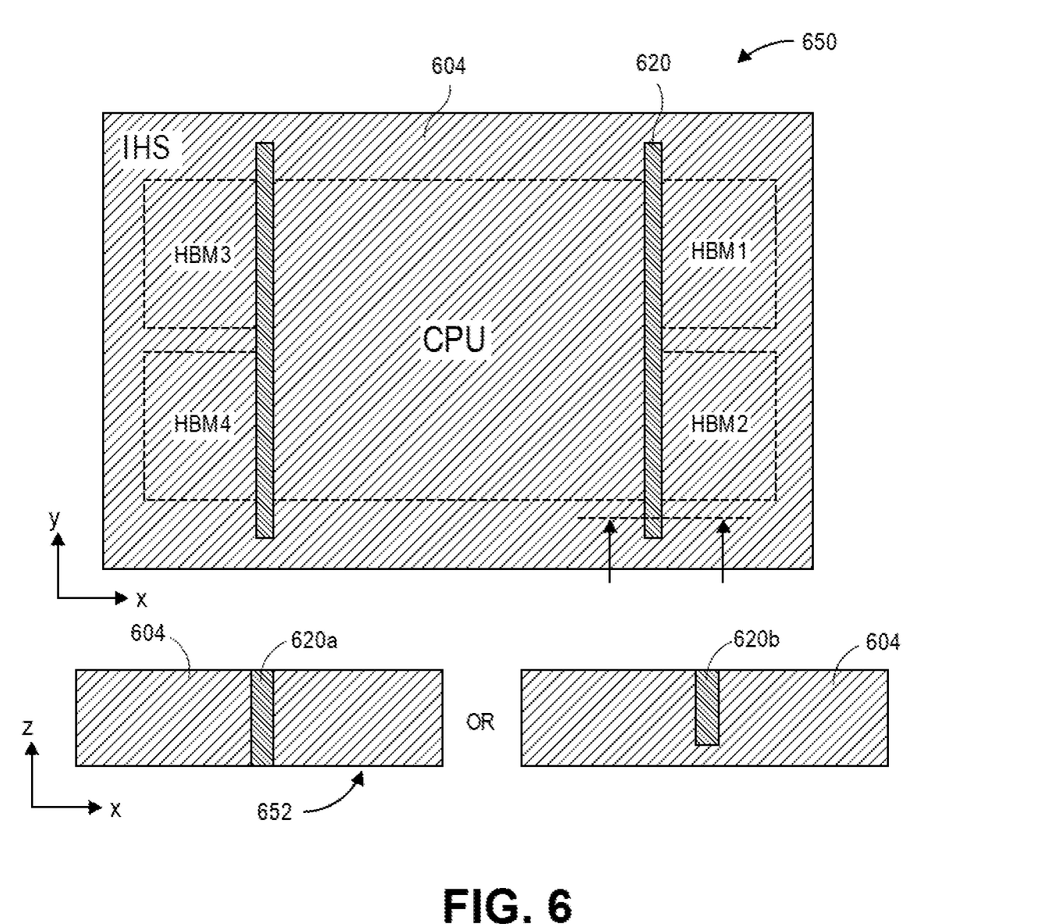
FIG. 6 illustrates a TEC that covers a portion of an IHS thickness, in accordance with embodiments

FIG. 6 illustrates a TEC that covers a portion of an IHS thickness, in accordance with embodiments. Diagram 650, which may be similar to diagram 150 of FIG. 1, is a top-down view of a multichip package that may include a TEC 620, that may be similar to TEC 120 of FIG. 1, that may be embedded in a IHS 604. The TEC 620 may be embedded in the IHS 604 in at least two non-limiting examples. The first example, referring to diagram 652, shows the TEC 620a embedded completely through the width of IHS 604. The second example shows a TEC 620b embedded only partially into the IHS 604.

Figure 7:
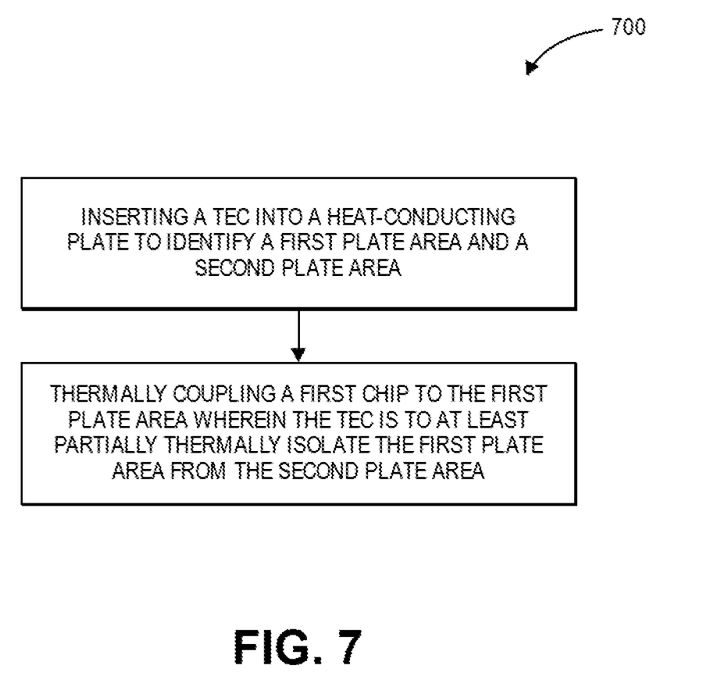
FIG. 7 illustrates an example of a process for manufacturing a package assembly, in accordance with embodiments.

FIG. 7 illustrates an example of a process for manufacturing a package assembly, in accordance with embodiments. In embodiments, process 700 may be performed by one or more of the techniques, processes, or actions described with respect to FIGS. 1-6.

At block 702, the process may include inserting a TEC into a heat-conducting plate to identify a first plate area and a second plate area. In embodiments, the heat conducting plate may be similar to IHS 104 of FIG. 1, IHS 304 of FIG. 3, IHS 404 of FIG. 4, IHS 504 of FIG. 5 and/or IHS 604 of FIG. 6. The first plate area may correspond to an area of the IHS 104 directly above the CPU 106 of FIG. 1, and the second plate area may correspond to an area of the IHS 104 that is directly above the HBM 108.

At block 704, the process may include thermally coupling a first chip to the first plate area, thermally coupling a second chip to the second plate area, and where the TEC is to at least partially thermally isolate the first plate area from the second plate area. In embodiments, the area of the IHS 104 directly above the CPU 106 of FIG. 1 may be thermally coupled to the CPU 106. The area of the IHS 104 that is directly above the HBM 108 of FIG. 1 may be thermally coupled to the HBM 108. The TEC 120 of FIG. 1 is to at least partially thermally isolate the CPU 106 from the HBM 108.

Figure 8:
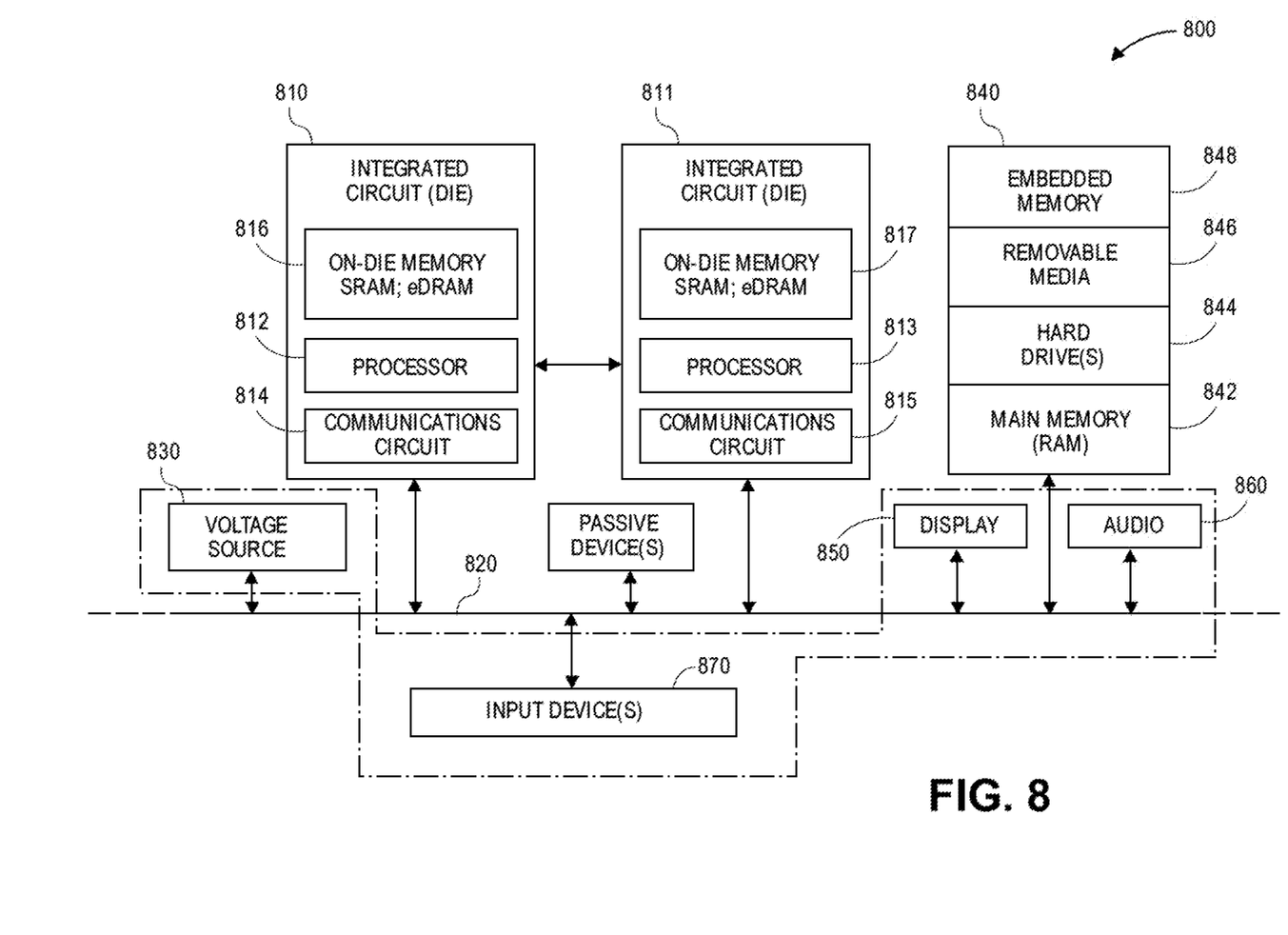
FIG. 8 is a schematic of a computer system 800, in accordance with an embodiment of the present invention.

FIG. 8 is a schematic of a computer system 800, in accordance with an embodiment of the present invention. The computer system 800 (also referred to as the electronic system 800) as depicted can embody a TEC embedded into an IHS, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a patterned thin film capacitor, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having a patterned thin film capacitor, according to any of the several disclosed embodiments and their equivalents, an electronic system, a computer system, one or more methods of fabricating an integrated circuit, and one or more methods of fabricating an electronic assembly that includes a package substrate having a patterned thin film capacitor, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having patterned thin film capacitor embodiments and their equivalents. A foundation substrate may be included, as represented by the dashed line of FIG. 8. Passive devices may also be included, as is also depicted in FIG. 8.

The following paragraphs describe examples of various embodiments.

Example 1 may be an apparatus comprising: a first heat-conducting plate to be thermally coupled to a first heat source; a thermoelectric cooler (TEC) thermally coupled to the first plate; a second heat-conducting plate thermally coupled to the TEC and to be thermally coupled to a second heat source; and wherein the TEC is to at least partially thermally isolate the first plate from the second plate to reduce heat transfer from the first plate to the second plate.

Example 2 may include the apparatus of example 1, wherein the first plate and the second plate are not directly coupled.

Example 3 may include the apparatus of example 1, wherein the TEC, when coupled to an electric power source, is to transfer heat from the second plate to the first plate.

Example 4 may include the apparatus of example 1, wherein the first heat source and the second heat source are not directly thermally coupled.

Example 5 may include the apparatus of example 1, wherein the first heat source is at a greater temperature than the second heat source.

Example 6 may include the apparatus of example 1, wherein the first heat source is a central processor unit (CPU) and wherein the second heat source is a high-bandwidth memory (HBM) chip.

Example 7 may include the apparatus of example 1, wherein the first plate and the second plate are integrated heat sinks (IHS).

Example 8 may include the apparatus of example 1, further comprising the first heat source and the second heat source.

Example 9 may include the apparatus of example 8, wherein the first plate coupled to the first heat source further includes a thermal interface material (TIM) disposed between the first plate and the first heat source; and wherein the second plate coupled to the second heat source further includes a TIM disposed between the second plate and the second heat source.

Example 10 may include the apparatus of example 1, wherein the TEC is a first TEC; and further comprising: a second TEC coupled to the first plate; a third heat-conducting plate coupled to the second TEC and to be coupled to a third heat source; wherein the first plate and the third plate are not directly coupled; and wherein the second TEC is to at least partially thermally isolate the first plate from the third plate to reduce heat transfer from the first plate to the third plate.

Example 11 may include the apparatus of example 1, wherein the first plate and the second plate are substantially in a plane.

Example 12 may be a package comprising: a first heatsink thermally coupled to a first chip; one or more second heatsinks thermally coupled, respectively, to one or more second chips; one or more TECs coupled to the one or more second heatsinks and to the first heatsink, wherein the one or more TECs are to at least partially thermally isolate the one or more second heatsinks from the first heatsink.

Example 13 may include the package of example 12, wherein the first heatsink is not directly coupled to the one or more second heatsinks.

Example 14 may include the package of example 12, wherein the first plate is at a greater temperature than at least one of the one or more second heatsinks.

Example 15 may include the package of example 14, wherein the one or more TECs are electrically coupled to a power source; and wherein the one or more TECs are to transfer heat from at least a portion of the one or more second heatsinks to the first heatsink.

Example 16 may include the package of example 12, further comprising a substrate; and wherein the first chip and the one or more second chips are coupled with the substrate.

Example 17 may include the package of any one of examples 12-16, wherein the first chip is a processor and at least one of the one or more second chips is a HBM chip.

Example 18 may include a method comprising: inserting a TEC into a heat-conducting plate to identify a first plate area and a second plate area; thermally coupling a first chip to the first plate area; thermally coupling a second chip to the second plate area; and wherein the TEC is to at least partially thermally isolate the first plate area from the second plate area.

Example 19 may include the method of example 18, further comprising:
applying electrical power to the TEC to cause heat to flow from the second plate area to the first plate area.

Example 20 may include the method of example 19, wherein the first chip is a processor and the second chip is a HBM chip; and wherein the flow of heat from the second area to the first plate area is to limit an operating temperature of the HBM chip.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A heatsink comprising:
   a trench in the heatsink, the trench with a first side and a second side opposite the first side;
   a first plate area to be thermally coupled to a first heat source, wherein the first plate area includes a portion of the first side of the trench;
   a thermoelectric cooler (TEC) thermally coupled to the first plate area;
   a second plate area thermally coupled to the TEC and to be thermally coupled to a second heat source, wherein the second plate area includes a portion of the second side of the trench; and
   wherein the TEC at least partially thermally isolates the first plate area from the second plate area to reduce heat transfer from the first plate area to the second plate area.

2. The heatsink of claim 1, wherein the trench extends from a first side of the heatsink to a second side of the heatsink opposite the first side of the heatsink.

3. The heatsink of claim 1, wherein the TEC, when coupled to an electric power source, is to transfer heat from the second plate area to the first plate area.

4. The heatsink of claim 1, wherein the first heat source and the second heat source are not directly thermally coupled.

5. The heatsink of claim 1, wherein the first heat source is at a greater temperature than the second heat source.

6. The heatsink of claim 1, wherein the first heat source includes a central processor unit (CPU) and wherein the second heat source includes a high-bandwidth memory (HBM) chip.

7. The heatsink of claim 1, wherein the first plate area and the second plate area are a portion of an integrated heat sink (IHS).

8. The heatsink of claim 1, further comprising the first heat source and the second heat source.

9. The heatsink of claim 8, wherein the first plate area coupled to the first heat source further includes a thermal interface material (TIM) disposed between the first plate area and the first heat source; and wherein the second plate area coupled to the second heat source further includes a TIM disposed between the second plate area and the second heat source.

10. The heatsink of claim 1, wherein the trench is a first trench and wherein the TEC is a first TEC; and further comprising:
    a second trench in the heatsink, the second trench with a first side and a second side opposite the first side;
    a third plate area to be thermally coupled to the first heat source, wherein the third plate area is a portion of the first side of the second trench;
    a second TEC coupled to the third plate area;
    a fourth plate area coupled to the second TEC and coupled to a third heat source, wherein the fourth plate area is a portion of the second side of the second trench.

11. The heatsink of claim 1, wherein the first plate area and the second plate area are substantially in a plane.

12. A package comprising:
    a first area of a heatsink thermally coupled to a first chip;
    one or more second areas of the heatsink thermally coupled, respectively, to one or more second chips;
    one or more TECs coupled to the one or more second areas of the heatsink and to the first heatsink, wherein the one or more TECs are to at least partially thermally isolate the one or more second heatsinks from the first heatsink; and
    wherein the one or more TECs are electrically coupled to a power source, the one or more TECs to transfer heat from at least a portion of the one or more second heatsinks to the first heatsink.

13. The package of claim 12, wherein the first area of the heatsink is not directly coupled to the one or more second areas of the heatsink.

14. The package of claim 12, wherein the first area of the heatsink is at a greater temperature than at least one of the one or more second areas of the heatsink.

15. The package of claim 12, further comprising a substrate; and
    wherein the first chip and the one or more second chips are coupled with the substrate.

16. The package of claim 12, wherein the first chip is a processor and at least one of the one or more second chips is a HBM chip.

17. A method comprising:
    inserting a TEC into a trench in a heatsink to identify a first heatsink area and a second heatsink area;
    thermally coupling a first chip to the first heatsink area;
    thermally coupling a second chip to the second heatsink area,
    wherein the TEC is to at least partially thermally isolate the first plate area from the second plate area; and
    applying electrical power to the TEC to cause heat to flow from the second heatsink area to the first heatsink area.

18. The method of claim 17, wherein the first chip is a processor and the second chip is a HBM chip; and
    wherein the flow of heat from the second area to the first plate area is to limit an operating temperature of the HBM chip.

* * * * *